(12) United States Patent
Siddiqui

(10) Patent No.: US 7,077,880 B2
(45) Date of Patent: Jul. 18, 2006

(54) SURFACE MODIFIED COLLOIDAL ABRASIVES, INCLUDING STABLE BIMETALLIC SURFACE COATED SILICA SOLS FOR CHEMICAL MECHANICAL PLANARIZATION

(75) Inventor: Junaid Ahmed Siddiqui, Richmond, VA (US)

(73) Assignee: DuPont Air Products Nanomaterials LLC, Tempe, AZ (US)

( * ) Notice: Subject to any disclaimer, the term of this patent is extended or adjusted under 35 U.S.C. 154(b) by 121 days.

(21) Appl. No.: 10/759,666

(22) Filed: Jan. 16, 2004

(65) Prior Publication Data

US 2005/0155296 A1 Jul. 21, 2005

(51) Int. Cl.
*C09C 1/02* (2006.01)
*C09G 1/04* (2006.01)

(52) U.S. Cl. ............................ 51/307; 51/308; 51/309; 106/3

(58) Field of Classification Search ................... 51/307, 51/308, 309; 106/3; 438/692, 693
See application file for complete search history.

(56) References Cited

U.S. PATENT DOCUMENTS

| 2,630,410 | A | 3/1953 | Clapsadle et al. |
|---|---|---|---|
| 3,139,406 | A | 6/1964 | Mindick et al. |
| 3,252,917 | A | 5/1966 | Mindick et al. |
| 3,293,093 | A | 12/1966 | Jones et al. |
| 3,620,978 | A | 11/1971 | Moore, Jr. |
| 3,745,126 | A | 7/1973 | Moore, Jr. |
| 4,252,671 | A | 2/1981 | Smith |
| 4,478,742 | A | 10/1984 | Payne |
| 4,769,073 | A | 9/1988 | Tastu et al. |
| 4,959,113 | A | 9/1990 | Roberts |
| 5,084,071 | A | 1/1992 | Nenadie et al. |
| 5,225,034 | A | 7/1993 | Yu et al. |
| 5,234,880 | A | 8/1993 | Cook et al. |
| 5,302,356 | A | 4/1994 | Shadman et al. |
| 5,340,370 | A | 8/1994 | Cadien et al. |
| 5,354,490 | A | 10/1994 | Yu et al. |
| 5,445,996 | A | 8/1995 | Kodera et al. |
| 5,527,423 | A | 6/1996 | Neville et al. |
| 5,735,963 | A | 4/1998 | Obeng |
| 5,773,364 | A | 6/1998 | Farkas et al. |
| 5,783,489 | A | 7/1998 | Kaufman et al. |
| 5,785,868 | A | 7/1998 | Li et al. |
| 5,891,205 | A | 4/1999 | Picardi et al. |
| 5,948,697 | A | 9/1999 | Hata |
| 5,958,228 | A | 9/1999 | Tokushima et al. |
| 5,958,288 | A | 9/1999 | Mueller et al. |
| 5,958,794 | A | 9/1999 | Bruxvoort et al. |
| 5,976,480 | A | 11/1999 | Mangold et al. |
| 5,980,775 | A | 11/1999 | Grumbine et al. |
| 5,997,620 | A | 12/1999 | Kodama et al. |
| 6,015,506 | A | 1/2000 | Streinz et al. |
| 6,022,400 | A | 2/2000 | Izumi et al. |
| 6,030,425 | A | 2/2000 | Hata |
| 6,068,787 | A | 5/2000 | Grumbine et al. |
| 6,117,026 | A | 9/2000 | Hayashi et al. |
| 6,117,775 | A | 9/2000 | Kondo et al. |
| 6,117,783 | A | 9/2000 | Small et al. |
| 6,140,239 | A | 10/2000 | Avanzino et al. |
| 6,156,661 | A | 12/2000 | Small et al. |
| 6,159,076 | A | 12/2000 | Sun et al. |
| 6,177,026 | B1 | 1/2001 | Wang et al. |
| 6,214,098 | B1 | 4/2001 | Lee |
| 6,235,693 | B1 | 5/2001 | Cheng et al. |
| 6,248,704 | B1 | 6/2001 | Small et al. |
| 6,251,150 | B1 | 6/2001 | Small et al. |
| 6,270,395 | B1 | 8/2001 | Towery et al. |
| 6,293,848 | B1 | 9/2001 | Fang et al. |
| 6,299,795 | B1 | 10/2001 | Lin et al. |
| 6,313,039 | B1 | 11/2001 | Small et al. |
| 6,332,831 | B1 | 12/2001 | Shemo et al. |
| 6,362,104 | B1 | 3/2002 | Wang et al. |
| 6,375,545 | B1 | 4/2002 | Yano et al. |
| 6,383,065 | B1 | 5/2002 | Grumbine et al. |
| 6,435,947 | B1 | 8/2002 | Mueller et al. |
| 6,461,227 | B1 | 10/2002 | Fang |
| 6,468,428 | B1 | 10/2002 | Nishii et al. |
| 6,498,131 | B1 | 12/2002 | Small et al. |
| 6,541,384 | B1 | 4/2003 | Sun et al. |

(Continued)

FOREIGN PATENT DOCUMENTS

EP 0 831 136 A2 3/1998

(Continued)

OTHER PUBLICATIONS

R.K. Iler, The Chemistry of Silica, Wiley Interscience, 1979, p. 410-411.

(Continued)

*Primary Examiner*—Michael A. Marcheschi
(74) *Attorney, Agent, or Firm*—Geoffrey L. Chase

(57) ABSTRACT

A composition and an associated method for chemical mechanical planarization (or other polishing) are described. The composition includes a surface-modified abrasive modified with at least one stabilizer and at least one catalyst differing from the at least one stabilizer. The composition can further include a medium containing the abrasive and an oxidizing agent (e.g., hydrogen peroxide), wherein the at least one catalyst is adapted to catalyze oxidation of a substrate by the oxidizing agent. Preferably, the abrasive is alumina, titania, zirconia, germania, silica, ceria and/or mixtures thereof, the stabilizer includes B, W and/or Al, and the catalyst is Cu, Fe, Mn, Ti, W and/or V. Both the stabilizer and the catalyst are immobilized on the abrasive surface. The method includes applying the composition to a substrate to be polished, such as substrates containing W, Cu and/or dielectrics.

22 Claims, 1 Drawing Sheet

U.S. PATENT DOCUMENTS

| | | | | |
|---|---|---|---|---|
| 6,896,710 | B1 * | 5/2005 | Grunwald | 51/307 |
| 2001/0036804 | A1 | 11/2001 | Mueller et al. | |
| 2001/0037821 | A1 | 11/2001 | Staley et al. | |
| 2002/0017063 | A1 | 2/2002 | Beitel et al. | |
| 2004/0029495 | A1 * | 2/2004 | Small et al. | 451/41 |

FOREIGN PATENT DOCUMENTS

| | | |
|---|---|---|
| EP | 0 844 290 A1 | 5/1998 |
| EP | 0 846 742 A2 | 6/1998 |
| EP | 0 984 048 A2 | 3/2000 |
| EP | 1 000 995 A1 | 5/2000 |
| EP | 1 020 501 A2 | 7/2000 |
| EP | 1 036 836 A1 | 9/2000 |
| EP | 1 072 662 A1 | 1/2001 |
| WO | 96/38262 | 12/1996 |
| WO | 99/53532 | 10/1999 |
| WO | 01/30928 A1 | 5/2001 |
| WO | 01/32794 A1 | 5/2001 |
| WO | 02/33736 A1 | 4/2002 |

OTHER PUBLICATIONS

B.L. Mueller, et al, Polishing Surfaces for Integrated Circuits, Chemtech, Feb. 1998, p. 38-46.

H. Landis, et al, Thin Solids Films, 220, p. 1. "Integration of Chemical Mechanical polishing into CMOS Integrated Circuit Manufacturing" date unknown.

RGR Bacon "the Initiation of Polymerisation Processes by Redox Catalysts" Quarterly Reviews, p. 287-310.

HJH Fenton "Oxidation of Tartaric Acid in Presence of Iron" 1894, 65 p. 899-910.

MCR Symons "Evidence for Formation of Free-Radical Intermediates in Some Reactions Involving Periodate" (1955) pp. 2794-2796.

Cheves Walling "Free Radicals in Solution" John Wiley & Sons (1957) pp. 564-579.

Abstract for "Comparison of Mineral and Soluble Iron Fenton's Catalysts for teh Trichloromethylene" by Teel et al., Water Research vol. 35(4) 2001, p. 977-984.

"The Chemistry of Silica" by R. K. Iler, Wiley Interscience (1979), p. 410-411.

Benjamin S. Lane and K. Burgess "A Cheap Catalytic, Scalable, and Environmentally Benign Method for Alkene Epoxidations" American Chem. Soc. vol. 123(12), 2001, p. 2933-2934.

"Mechanistic Aspects of Chemical mechanical Polishing of tungsten Using Ferric Ion Based Alumina Slurries" by Raghunath et al., ESP, vol. 96-22, pp. 1-15.

"Electrochemical Aspects of the Chemical Mechanical Planarization of Tungsten" by Basak et al., ESP vol. 96-22, pp. 137-148.

* cited by examiner

SURFACE MODIFIED COLLOIDAL ABRASIVES, INCLUDING STABLE BIMETALLIC SURFACE COATED SILICA SOLS FOR CHEMICAL MECHANICAL PLANARIZATION

BACKGROUND OF THE INVENTION

The present invention pertains to surface-modified colloidal abrasive polishing compositions and associated methods of using these compositions, particularly for chemical mechanical planarization (CMP, also known as chemical mechanical polishing).

CMP is now widely known to those skilled in the art and has been described in numerous patents and open literature publications. Some introductory references on CMP are as follows: "Polishing Surfaces for Integrated Circuits", by B. L. Mueller and J. S. Steckenrider, Chemtech, February, 1998, pp. 38–46; and H. Landis et al., Thin Solids Films, 220 (1992), p. 1.

In a typical CMP process, a substrate (e.g., a wafer) is placed in contact with a rotating polishing pad attached to a platen. A CMP slurry, typically an abrasive and chemically reactive mixture, is supplied to the pad during CMP processing of the substrate. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate.

CMP processing is often employed in semiconductor manufacturing to remove excess metal at different stages. Typically, metal CMP slurries contain an abrasive, such as silica or alumina, suspended in an oxidizing, aqueous medium.

Surface modification of the abrasive is known. Colloidal silica, for example, has been modified with various metallic compounds as disclosed in U.S. Pat. Nos. 3,252,917, 3,620, 978 and 3,745,126; EP Patent Publication 1 000 995 A1; and also in the book entitled "The Chemistry of Silica", R. K. Iler, Wiley Interscience (1979), pages 410–411.

Colloidal silica has been stabilized with boric acid as disclosed in U.S. Pat. No. 2,630,410. See also co-pending U.S. patent application Ser. No. 10/245,440, filed Sep. 17, 2002, which discloses a surface-modified colloidal abrasive (e.g., ceria or silica) that has been modified with boron-containing compound(s).

In order to achieve fast tungsten or copper removal rates, oxidants and co-oxidants have been reported in the patent literature. For tungsten CMP, oxidants such as periodic acid, potassium iodate, ferric nitrate, and hydrogen peroxide ($H_2O_2$) are commonly used. For copper CMP, $H_2O_2$ is a commonly used oxidant. Of all the oxidants in commercial use, $H_2O_2$ is low cost, and it is benign from the standpoint of product stewardship, as the byproduct is water. However $H_2O_2$ is a poor oxidant for tungsten as it reacts very slowly, so an additive that can catalyze the reaction between tungsten and $H_2O_2$ during CMP is highly desirable. See, e.g., U.S. Pat. No. 5,958,288 to Mueller et al., which describes the use of soluble metal co-catalysts for activating $H_2O_2$ for the planarization of tungsten. See also SU 1629353, which discloses a composition and method for CMP of aluminum alloys, wherein soluble iron (iron chloride) is used to activate sodium perborate in the presence of diethyldithiophosphoric acid and ninhydrin. SU 120891 discloses a composition and method for CMP of stainless steel, wherein the composition comprises nitric acid, hydrochloric acid, water, oxalic acid, silicon dioxide powder, and acid potassium fluoride as a halogen ion source.

While the use of soluble metal co-catalysts increases the speed at which $H_2O_2$ reacts with tungsten, they also require CMP slurries with large concentrations of dissolved, ionic metallic components. As a result, the polished substrates can become contaminated by the adsorption of charged species from the metal co-catalysts. These species can migrate and change the electrical properties of the devices, for example at gates and contacts, and change the effective dielectric properties of dielectric layers. These changes may reduce the reliability of the integrated circuits with time. Therefore, it is desirable to expose the wafer only to high purity chemicals with very low concentrations of mobile metallic ions.

Accordingly, it is desired to provide a polishing composition that does not contain large concentrations of dissolved metal ions. It is further desired to provide a polishing composition particularly suitable for conducting metal CMP, such as copper CMP and tungsten CMP, which composition contains an additive to catalyze the reaction between metal substrate and $H_2O_2$, but does not contain large concentrations of dissolved metal ions.

All references cited herein are incorporated herein by reference in their entireties.

BRIEF SUMMARY OF THE INVENTION

Accordingly, the invention provides a surface-modified abrasive modified with at least one stabilizer and at least one catalyst differing from the at least one stabilizer.

Also provided is a composition comprising a medium containing the abrasive and an oxidizing agent, wherein the at least one catalyst is adapted to catalyze oxidation of a substrate by the oxidizing agent.

Further provided is a composition comprising an abrasive having a surface on which at least one stabilizer and at least one catalyst are bonded, provided that the at least one stabilizer differs from the at least one catalyst.

Still further provided is a composition comprising an abrasive having a surface on which at least one stabilizer and at least one catalyst are bonded, wherein the abrasive is a member selected from the group consisting of alumina, titania, zirconia, germania, silica, ceria and mixtures thereof, the at least one stabilizer comprises at least one element selected from the group consisting of B, W and Al, and the at least one catalyst comprises at least one element selected from the group consisting of Cu, Fe, Mn, Ti, W and V, provided that the at least one stabilizer and the at least one catalyst are not simultaneously W.

Still further provided is a composition comprising:
an abrasive having a surface on which at least one stabilizer and at least one catalyst are bonded provided that the at least one stabilizer differs from the at least one catalyst;
an oxidizing agent; and
a medium in which the abrasive and the oxidizing agent are contained,
wherein the at least one catalyst is adapted to catalyze an oxidation reaction of the oxidizing agent with a substrate.

Still further provided is a method for polishing a surface of a substrate, said method comprising applying the composition of the invention to the surface of the substrate to polish the surface of the substrate, wherein the substrate comprises at least one element selected from the group consisting of W, Ti, Cu, Ta, Si, Ga, As, C and N, more preferably a member selected from the group consisting of W, Ti, TiN, Ta, TaN, Cu and $SiO_2$.

BRIEF DESCRIPTION OF SEVERAL VIEWS OF THE DRAWINGS

The invention will be described in conjunction with the following drawings in which like reference numerals designate like elements and wherein.

DETAILED DESCRIPTION OF THE INVENTION

Figure 1:
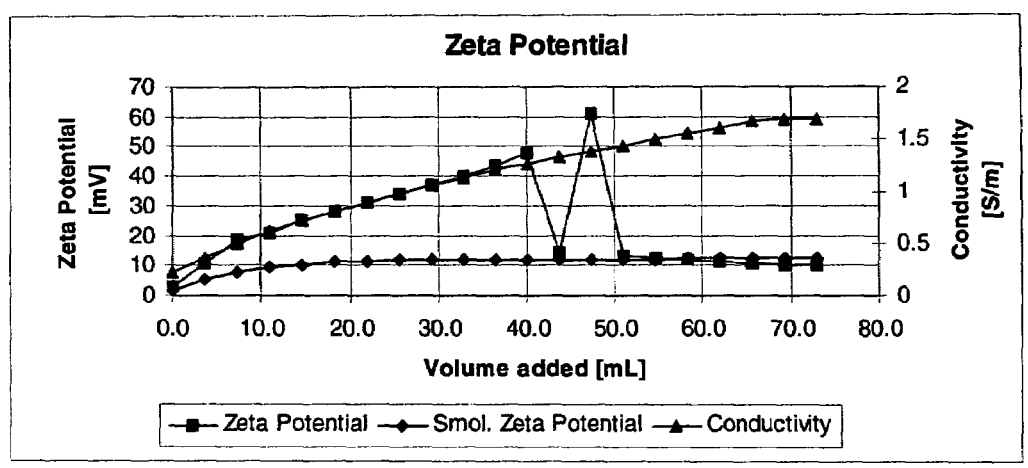
FIG. 1 is a graph of the zeta potential of a boric acid-ferric nitrate modified silica sol, wherein bimetallic hybrid particles have positive zeta potential and boron modified particles have negative zeta potential.

This invention provides compositions and methods that are particularly useful for polishing substrates such as metal-containing substrates, tungsten-containing substrates, copper-containing substrates, titanium-containing substrates, titanium-nitride containing substrates, tantalum-containing substrates, tantalum-nitride containing substrates, and other substrates associated with integrated circuits, thin films, semiconductors, and wafers. The invention is especially useful for CMP.

The invention eliminates the need for adding soluble metal catalysts to catalyze oxidation by hydrogen peroxide (but does not necessarily exclude the use of soluble metal catalysts in certain embodiments). The invention improves the CMP process as well as minimizes contamination, as there is no need to add soluble salt catalysts in the CMP formulation. Other advantages provided by at least some embodiments of the invention include: (a) relatively low CMP slurry costs; (b) no staining or yellowing of the polishing pad; (c) low metal ions (or other counter-ions of metal salt catalysts) as impurities in the CMP slurry; (d) employing commonly available hydrogen peroxide; and (e) low static etch rate of metal substrates.

The compositions of the invention comprise a surface-modified abrasive modified with at least one stabilizer and at least catalyst. The stabilizer and the catalyst are bonded to the surface of the abrasive by means discussed in detail below.

The abrasive is typically a metal oxide abrasive preferably selected from the group consisting of alumina, titania, zirconia, germania, silica, ceria and mixtures thereof. Preferred abrasives include, but are not limited to, colloidal silica, colloidal ceria, and colloidal titania, with colloidal silica being most preferred.

The metal oxide abrasive may be produced by any technique known to those skilled in the art.

Due to stringent purity requirements in the integrated circuit industry, the preferred metal oxide should be of a high purity. High purity means that the total impurity content, from sources such as raw material impurities and trace processing contaminants, is typically less than 1% and preferably less than 0.01% (i.e., 100 ppm).

In preferred embodiments, the metal oxide abrasive consists of metal oxide aggregates and particles having a size distribution less than about 1.0 micron, a mean diameter less than about 0.4 micron and a force sufficient to repel and overcome the van der Waals forces between abrasive aggregates and particles themselves. Such metal oxide abrasive has been found to be effective in minimizing or avoiding scratching, pit marks, divots and other surface imperfections during polishing. The particle size distribution in the present invention may be determined utilizing known techniques such as transmission electron microscopy (TEM). The mean particle diameter refers to the average equivalent spherical diameter when using TEM image analysis, i.e., based on the cross-sectional area of the particles. By force is meant that either the surface potential or the hydration force of the metal oxide particles must be sufficient to repel and overcome the van der Waals attractive forces between the particles.

A spherical or approximately spherical particle is preferred in this invention.

In another preferred embodiment, the metal oxide abrasive may consist of discrete, individual metal oxide particles having discrete particle diameters from 5 nanometers to 5 microns, preferably 5 nanometers to 500 nanometers, more preferably from 10 nanometers to 100 nanometers.

Compositions of the invention further comprise at least one stabilizer. As used herein, the term "stabilizer" means an agent effective to help maintain the abrasive as a sol in an aqueous medium. Suitable stabilizers are compounds which include non-metallic boron, aluminum and titanium, with boron being most preferred.

Compositions of the invention further comprise at least one catalyst. As used herein, the term "catalyst" means an agent effective to catalyze a reaction that decomposes $H_2O_2$ on the solid substrate. Preferred catalysts possess multiple oxidation states, and include, e.g. Cu, Fe, Mo, Mn, Ti, W, V and mixtures thereof. Suitable catalysts are preferably effective to catalyze the oxidation of metal substrates by $H_2O_2$. Iron is the most preferred catalyst.

In particularly preferred embodiments, the inventive composition comprises a surface-modified colloidal abrasive containing on the surface of the abrasive: a stabilizer comprising boron and a catalyst comprising iron; a stabilizer comprising boron and a catalyst comprising copper; or a catalyst comprising iron and a stabilizer comprising tungsten. (It should be apparent from the foregoing that the terms "metal" and "bimetallic" as used herein in the context of surface modification are intended to encompass non-metallic boron, as well as more prototypical metals.) Other combinations of metals are also possible, as are combinations of metals and non-metals (e.g., the non-metals/organics and inorganic-organic combinations taught by copending U.S. patent application Ser. No. 10/315,398, filed Dec. 9, 2002.) Phosphorus is a particularly preferred non-metal suitable for use in mixed metal/non-metal surface-modified abrasives of the invention.

It is preferred that at least 1%, more preferably 40–95%, even more preferably 80–95% of available surface sites on the abrasive be occupied by the stabilizer and the catalyst. The percentage of surface sites covered on an abrasive in a composition of this invention can range up to 100%.

The molar ratio of catalyst to stabilizer can vary depending upon the substrate and the nature and quantity of any oxidizing agent being used. Similarly, the molar ratio of catalyst to abrasive can also vary depending upon conditions and desired results. For example, the molar ratio of catalyst to stabilizer preferably ranges from 1:1 to 1:10 and the molar ratio of catalyst to abrasive preferably ranges from 1:1 to 1:10. In certain embodiments, the molar ratio of stabilizer to abrasive ranges from 10:1 to 1:10.

The amount of surface-modification of the colloidal abrasive with stabilizer depends upon the average size of the colloidal abrasive particles. Colloidal abrasive particles that are smaller and which consequently have less surface area generally require higher relative amounts of stabilizer than do larger particles, which have more surface area. As a non-limiting illustrative example for boric acid surface-modified colloidal silica, the various sizes of colloidal particles required the approximate levels of boric acid modification as shown in the table below in order to achieve good stability towards gel formation in acidic media, such as metal CMP polishing compositions.

| Average Particle Diameter (Nanometers, nm) | Relative Amount of Boric Acid (R, unitless) | % Surface Modification* |
| --- | --- | --- |
| 12 | 8.0 | 92 |
| 23 | 6.0 | 95 |
| 50 | 4.3 | 98 |
| 100 | 2.0 | 99 |

R = 100 × (moles of boric acid)/(moles of silica)
*Approximate values

The surface coverage of the surface modified abrasive can be characterized using zeta potential measurement. For example, the amount of surface coverage of boric acid on the silica surface can be measured using a Colloidal Dynamics instrument, manufactured by Colloidal Dynamics Corporation, 11-Knight Street, Building E8, Warwick, R.I., 02886. The Colloidal Dynamics instrument measures the zeta potential (surface charge) of the surface modified silica particles. During the preparation of boric acid modified silica, boric acid is added to the deionized silica particles, which changes the zeta potential of the silica particle surface. After reaching the full surface coverage, there is no change in the zeta potential of the surface modified silica. From this titration curve of zeta potential as a function of grams of boric acid to a given amount of silica, it is possible to measure the percent surface coverage of boric acid on the silica surface. After completing the reaction with boric acid, the surface coverage achieved by reacting the boron-modified sol with the second metal salt can also be determined from the zeta potential.

It is also possible to provide surface-modified abrasives containing more than two different agents bonded to their surfaces. Thus, multimetallic surface-modified abrasives containing at least two different metals on the surface of the abrasive are also within the scope of the invention, as are combinations of at least two different inorganic-organic agents.

The foregoing surface-modified abrasive compositions of the invention disclosed herein are useful for metal polishing, especially when incorporated into a CMP slurry and applied to a pad.

Slurry compositions further comprise in addition to the surface-modified abrasive, an oxidizing agent and a medium in which the abrasive and the oxidizing agent are contained.

The oxidizing agent is an organic per compound, an inorganic per compound, a non-per compound, or mixtures thereof. Preferably, the oxidizing agent is a monopersulfate, persulfate, peroxide, periodate or mixtures thereof. More preferably, the oxidizing agent comprises at least one of periodic acid, hydrogen peroxide and urea-hydrogen peroxide, with hydrogen peroxide being most preferred, particularly when the acid component is a non-oxidizing acid (e.g., sulfuric acid). The oxidizing agent should be selected in conjunction with the catalyst, as the latter should catalyze oxidation of the substrate by the oxidizing agent.

The oxidizing agent is preferably present in the CMP slurry in an amount ranging from about 0.1 to about 50.0 weight percent (based on the total weight of the slurry). It is preferred that the oxidizing agent be present in the slurry in an amount ranging from about 0.5 to about 5.0 weight percent.

The medium is preferably aqueous and more preferably deionized water.

The surface-modified abrasive is preferably present in the CMP slurry in an amount of about 0.1 to about 20 weight percent, preferably about 0.5 to about 6 weight percent.

Other well known polishing slurry additives may be incorporated alone or in combination into the CMP slurry of this invention. A non-inclusive list includes inorganic acids, organic acids, corrosion inhibitors, chelating agents, surfactants, alkyl ammonium salts or hydroxides, and dispersing agents.

An additive that may be useful with this invention is one that stabilizes the oxidizer in the presence of the metal complex. It is well known that hydrogen peroxide is not very stable in the presence of many metal ions without the use of stabilizers. Useful stabilizers include phosphoric acid, organic acids (e.g., acetic, citric, tartaric, orthophthalic, and ethylenediaminetetracetic acid), tin oxides, phosphonate compounds and other ligands that bind to the metal and reduce its reactivity toward hydrogen peroxide decomposition. These additives can be used alone or in combination and significantly decrease the rate at which hydrogen peroxide decomposes, and may also effect metal polishing rates.

In certain embodiments of the invention, the polishing composition can also include an alkyne compound having at least one hydroxyl substituent, as disclosed in copending U.S. patent application Ser. No. 10/315,398, filed Dec. 9, 2002.

The pH of the compositions of this invention is not limited and can be chosen to be that corresponding to an acidic, a basic, or a neutral value. In this case, a suitable slurry pH is from about 2 to about 10. In some embodiments designed for metal CMP applications, it is desirable to have an acidic pH for efficient metal removal during CMP processing. In this case, the pH can range from about 1 to about 6, and preferably be in the range of 2 to 4.

Suitable acid components for these compositions include, but are not limited to, sulfuric acid, hydrochloric acid, nitric acid, hydrofluoric acid, phosphoric acid, periodic acid, and organic acid(s). Inorganic acids are preferred. The compositions of this invention can contain one or more acids, which in the latter case, independently can be either oxidizing acids or non-oxidizing acids.

The associated methods of this invention comprise the use of the aforementioned compositions for polishing substrates (e.g., base materials such as bare silicon wafers) and CMP of substrates comprised of metal and dielectric material. Typically, a substrate (e.g., a wafer) is placed face-down on a polishing pad which is fixedly attached to a rotatable table of a polisher. In this manner, the substrate to be polished is placed in direct contact with the polishing pad. A wafer carrier system or polishing head is used to hold the substrate in place and to apply a downward pressure against the backside of the substrate during CMP processing while the table and the pad are rotated. The polishing composition (e.g., CMP slurry) is applied (usually continuously) on the pad during CMP processing to effect the removal of material to (at least partially) planarize the substrate.

The composition and associated methods of this invention are effective for CMP of a wide variety of substrates, including substrates having dielectric portions that comprise materials having low dielectric constants (low-k materials, such as materials having a dielectric constant less than 3.3). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Similarly, the composition and associated methods of this invention are effective for CMP of substrates comprised of various metals, including, but not limited to, tungsten and copper. The composition and associated methods of this invention are particularly useful and preferred for tungsten CMP and afford very high selectivities for removal of tungsten in relation to dielectric (as illustrated in the examples). In certain embodiments, the selectivity for removal of tungsten relative to removal of the dielectric from the substrate is at least 5:1, more preferably at least 10:1, and even more preferably at least 15:1.

A preferred method for synthesizing a bimetallic surface-modified colloidal abrasive particle of the invention comprises the following two-step process. The first step provides a boron or tungsten modified surface-modified colloidal abrasive particle, as discussed above, and the second step adds a second metal (e.g., iron, copper or tungsten) to the surface of the boron or tungsten modified surface-modified colloidal abrasive particle.

EXAMPLES

The invention will be illustrated in more detail with reference to the following Examples, but it should be understood that the present invention is not deemed to be limited thereto.

Example 1

Step 1: Preparation of Boron-Modified Silica Sol

This example describes the preparation of boron surface-modified colloidal silica starting with colloidal silica particles having an average particle diameter of 40 to 55 nanometers.

Approximately 1 kg of AMBERLITE IR-120 ion exchange resin (Rohm and Haas Company, Philadelphia, Pa.) was washed with 1 liter of 20% sulfuric acid solution. The mixture was stirred and the resin was allowed to settle. The aqueous layer was decanted and washed with 10 liters of deionized water. The mixture was again allowed to settle and then the aqueous layer was decanted. This procedure was repeated until the decanted water was colorless. This procedure afforded an acidic form of resin.

SYTON® HT 50 (12 kg, approximately 2.27 gallons, DuPont Air Products NanoMaterials L.L.C., Carlsbad, Calif.) was placed in a five-gallon mix tank equipped with an agitator. 2.502 kg of deionized water were added to the tank and the solution was allowed to mix a few minutes. The pH of the solution was measured to be approximately 10.2. With continued pH monitoring, small amounts of acid-state resin were added, while allowing the pH to stabilize in between additions. Additional resin was added in small portions until the pH had dropped to pH 1.90–2.20. Once this pH limit had been reached and was stable in this range, no further resin additions were made and the mixture was stirred for 1–1.5 hours. Subsequently, the mixture was passed through a 500-mesh screen to remove the resin and afforded deionized SYTON HT 50.

A solution of 268 g of boric acid powder (Fisher Scientific, 2000 Park Lane, Pittsburgh, Pa., 15275) in 5.55 kg of deionized water was prepared in a 10 gallon mixing tank equipped with an agitator and a heater by slowly adding the boric acid powder until all had been added to the water and then agitating the mixture for 15 hours and increasing the temperature of the mixture to 55–65° C. Deionized and diluted SYTON HT 50 (14.5 kg) was then added to the boric acid solution slowly over about 1.2 hours by adding it at approximately 200 ml/minute and maintaining the temperature greater than 52° C. while agitating the mixture. After this addition was completed, heating at 60° C. and agitation of the mixture were continued for 5.5 hours. The resulting solution was subsequently filtered through a 1-micron filter to afford boron surface-modified colloidal silica.

This boron surface-modified colloidal silica was characterized for colloid stability over 15 days using a Colloidal Dynamics instrument (11-Knight Street, Building E8, Warwick, R.I., 02886), and was found to exhibit both constant pH (pH approximately 6.6) and zeta potential (zeta potential approximately −58 millivolts) over the 15-day test period. The percentage of surface sites of this surface-modified colloidal silica occupied by boron-containing compound(s) was approximately 98%.

Step 2: Reaction of Boron-modified Sol with Ferric Nitrate

Boron-modified silica from Step 1 (1000 grams) was transferred to a 4-liter beaker. Under agitation, 5.1 grams of ferric nitrate were added to the boron-modified silica. The mixture was heated between 45 to 50° C. for 2 hours and 50 minutes. After heating the mixture, the dispersion was cooled. The zeta-potential changed from −58 millivolts to +10.2 millivolts. In the surface modified hybrid bimetallic sol, the molar ratio of iron to boric acid was 1:43 (or 0.023), and the molar ratio of iron to silica was 0.25 (or 1:4). The pH of the slurry was measured as 2.09.

Example 2

Addition of Boric Acid-Iron Nitrate Mixture to Deionized SYTON HT 50

In this procedure, deionized SYTON HT 50 at pH 2 (600 grams, supplied by DuPont Air Products NanoMaterials L.L.C.), was transferred to a 4-liter beaker. Under agitation, 400 grams of deionized water were added, followed by the addition of a mixture of boric acid (12 grams) and ferric nitrate (10.1 grams). After the addition of boric acid and ferric nitrate, an additional 278 grams of water were added. The mixture was heated between 45 and 50° C. for 2.5 hours. After heating, the mixture was cooled, the molar ratio of iron to silica was 1:2 (0.5), the molar ratio of iron to boric acid was 2:4.3 (0.47), the pH was 1.67, and the zeta potential was +16.4 millivolts. In FIG. 1, the zeta-potential graph shows how zeta-potential changes from the zero or slightly negatively charged surface to the positively charged surface.

Example 3

In this example, Example 2 was repeated using a molar ratio of iron to silica of 1:4 (0.25) and a molar ratio of iron to boric acid of 1:4.3 (0.23). The pH of the surface modified was 2.11, and the zeta potential was +25.2 millivolts. This example shows that the pH and zeta potential can be controlled by changing the concentration of ferric nitrate or boric acid.

Example 4

Figure 2:
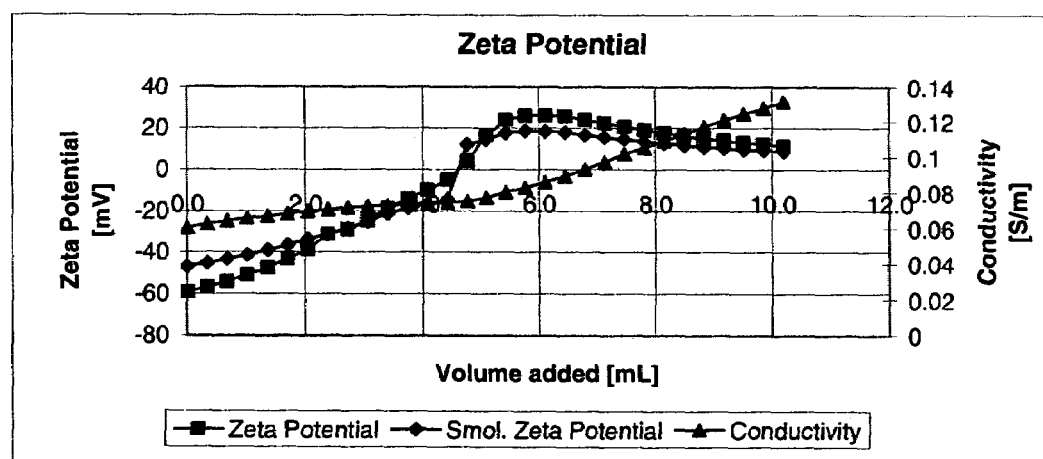
FIG. 2 is a graph of the zeta potential of a tungsten silicate surface changed from negative zeta potential to positive zeta potential after reacting with ferric nitrate.

Deionized SYTON HT 50 was prepared in accordance with Example 1. 10.1 grams of ferric nitrate were added to the deionized SYTON HT 50 (600 grams, pH=1.9 to 2.1). The mixture was heated for 1 hour at 50° C. In a separate beaker, 300 grams of deionized water were charged, and kept under agitation. To this water solution, sodium tungstate (10.9 grams) was added under agitation during a period of 10 minutes. This solution had a pH of 7.14. After completing the addition of sodium tungstate to the deionized water, 5 grams of 70% nitric acid were added to adjust the pH to 5.02. The mixture was stirred at room temperature for an additional 10 minutes. The tungstate solution was then added to the iron-modified silica particles, and stirred for an additional 2 hours. The pH was 6.13 and the zeta potential is shown in FIG. 2.

Examples 5, 6, 7, 8 and 9

Polishing Experiments

In Table 1, polishing compositions are tabulated. The polishing composition in Example 5 was prepared using boron-modified silica and the preparation method of Example 1 (Step 1). The polishing composition in Example 6 was prepared using bimetallic "boron-iron" modified silica and the preparation method of Example 2. The polishing composition in Example 7 was prepared using "iron-tungsten" modified silica and the preparation method of Example 4. The polishing composition in Example 8 was prepared using boron-modified silica, the preparation method of Example 1 (Step 1), and soluble iron catalyst. The polishing composition in Example 9 was prepared using "boron-iron" modified silica and the preparation method of Example 1 (Step 2). The polishing compositions were used to polish CVD tungsten blanket wafers and PETEOS blanket wafers (PETEOS, plasma enhanced tetraethoxy silane, dielectric oxide layer) using a polishing tool. The blanket wafers were purchased from Silicon Valley Microelectronics, 1150 Campbell Ave CA 95126. The PETEOS wafers had a film thickness specification of 15,000 Å PETEOS. The CVD tungsten wafers had film stack thickness specifications of 8000 Å CVD tungsten/250 Å titanium/6300 Å thermal oxide. A SpeedFam IPEC, model 472 (manufactured by SpeedFam IPEC, 305 North 54th street, Chandler, Ariz. 85226), polishing machine was used with conditions set as follows:

Down force=7 psi (pounds per square inch)

Flow rate of polishing composition=170 ml/min (milliliters per minute)

Back pressure=0.5 psi

Carrier speed=35 psi

Platen speed=40 revolutions per minute (RPM)

The substrate was effectively planarized using the above polishing composition under the stated conditions.

TABLE 1

Comparison of tungsten removal rate using boron modified silica with bimetallic metal containing silica. Each formulation up to 4 Kg, acid or base added to control pH.

|  | EXAMPLE 5 (comparative) | EXAMPLE 6 | EXAMPLE 7 | EXAMPLE 8 (comparative) | EXAMPLE 9 |
|---|---|---|---|---|---|
| Notes | Boron modified SYTON HT 50 (control) | SYTON HT 50 with modified $H_3BO_3$—Fe—, bimetallic surface | SYTON HT 50 with modified Fe-tungstate, bimetallic surface | Boron modified SYTON HT 50 (control with soluble ferric nitrate as soluble catalyst, 35 ppm) | SYTON HT 50 with modified $H_3BO_3$—Fe—, bimetallic surface |
| pH | 2.8 | 2.8 | 2.8 | 2.8 | 2.8 |
| Silica | 180 gram | 180 grams | 180 grams | 180 grams | 180 grams |
| Water | 3249 grams | 3249 grams | 3249 grams | 3249 grams | 3249 grams |
| $H_2O_2$ (30%) | 400 grams | 400 grams | 400 grams | 400 grams | 400 grams |
| Tungsten removal rate | 427 Å/min | 3880 Å/min | 2655 Å/min | 2049 Å/min | 2751 Å/min |
| PETEOS removal rate | 85 Å/min | 217 Å/min | 87 Å/min | 83 Å/min | 91 Å/min |
| Selectivity (Tungsten removal rate/ PETEOS removal rate) | 5 | 18 | 31 | 25 | 30 |

Clearly, compared to comparative Example 5, polishing data show high tungsten removal rates using hybrid bimetallic silica abrasives in the tungsten CMP formulation. The tungsten removal rates for embodiments of the invention (Examples 6, 7 and 9) were comparable to that of comparative Example 8, wherein a soluble metal catalyst (ferric nitrate) and boron-modified silica were used instead of a self-catalyzed bimetallic modified silica of the invention. In Examples 6, 7 and 9, the catalyst is immobilized on the abrasive surface, whereas in Example 8, the catalyst is in the solution phase, and difficult to remove. Thus, the bimetallic abrasive not only catalyzes the oxidation of the tungsten layer on the substrate by acting as a heterogeneous catalyst, but also facilitates the mechanical removal of tungsten oxide during polishing.

While the invention has been described in detail and with reference to specific examples thereof, it will be apparent to one skilled in the art that various changes and modifications can be made therein without departing from the spirit and scope thereof.

The invention claimed is:

1. A polishing composition for use in combination with an oxidizing agent for polishing a substrate, said composition comprising an abrasive particle having a surface on which at least one stabilizer comprising B, Al, or mixtures thereof and at least one catalyst are bonded, provided that the at least one stabilizer differs from the at least one catalyst, and wherein the at least one catalyst catalyzes an oxidation reaction of a per-compound oxidizing agent with a substrate during polishing.

2. The composition of claim 1, further comprising: an oxidizing agent which is a per compound; and a medium in which the abrasive and the oxidizing agent are contained.

3. The composition of claim 2, wherein the oxidizing agent is hydrogen peroxide and the medium is deionized water.

4. The composition of claim 1, wherein the abrasive is a member selected from the group consisting of alumina, titania, zirconia, germania, silica, ceria and mixtures thereof, the at least one stabilizer comprises B, and the at least one catalyst comprises at least one member selected from the group consisting of Cu, Fe, Mo, Mn, Ti, W and V.

5. The composition of claim 1, wherein the abrasive is a member selected from the group consisting of alumina, titania, zirconia, germania, silica, ceria and mixtures thereof, the at least one stabilizer comprises Al, and the at least one catalyst comprises at least one member selected from the group consisting of Cu, Fe, Mn, Ti, W and V.

6. The composition of claim 4, wherein the abrasive particle is colloidal silica.

7. The composition of claim 4, wherein the abrasive particle comprises colloidal silica.

8. The composition of claim 4, wherein the catalyst comprises Fe, Cu, or mixture thereof.

9. The composition of claim 4, wherein the abrasive particle is silica, and the at least one catalyst comprises Fe.

10. The composition of claim 4, wherein the abrasive is silica, and the at least one catalyst comprises Cu.

11. The composition of claim 5, wherein the abrasive is silica, and the at least one catalyst comprises Fe, Cu, or mixture thereof.

12. A polishing composition for use in combination with an oxidizing agent for polishing a substrate, said composition comprising:

an abrasive particle having a surface on which are bonded at least one stabilizer and at least one catalyst, provided that the at least one stabilizer differs from the at least one catalyst;

an oxidizing agent; and a medium in which the abrasive and the oxidizing agent are contained, wherein the at least one catalyst catalyzes an oxidation reaction of the oxidizing agent with a substrate, and wherein the stabilizer is bonded to the abrasive prior to or simultaneously with the bonding the catalyst to the abrasive wherein the stabilizer comprises B, Al, or W.

13. The composition of claim 12, wherein the abrasive is a member selected from the group consisting of alumina, titania, zirconia, germania, silica, ceria and mixtures thereof, the at least one stabilizer comprises at least one member selected from the group consisting of boric acid, tungstate, and a stabilizer comprising Al, the at least one catalyst comprises at least one member selected from the group consisting of Cu and Fe, wherein the stabilizer is bonded to the abrasive prior to the bonding the catalyst to the abrasive, and the oxidizing agent is at least one member selected from the group consisting of periodic acid, hydrogen peroxide and urea-hydrogen peroxide.

14. The composition of claim 12, wherein the abrasive is silica, at least one stabilizer comprises Boron, and at least one catalyst is Fe and the oxidizing agent is hydrogen peroxide.

15. The composition of claim 12, wherein the abrasive is silica, the at least one stabilizer comprises Boron, and at least one catalyst is Cu and the oxidizing agent is hydrogen peroxide.

16. The composition of claim 12, wherein the abrasive is silica, the at least one stabilizer comprises W in the form of tungstate, the at least one catalyst is Fe and the oxidizing agent is hydrogen peroxide.

17. A polishing composition for use in combination with an oxidizing agent for polishing a substrate, said composition comprising an abrasive particle having a surface on which at least one stabilizer and at least one catalyst are bonded, wherein the abrasive is a member selected from the group consisting of alumina, titania, zirconia, germania, silica, ceria and mixtures thereof, wherein the at least one stabilizer comprises phosphorus, and wherein the at least one catalyst comprises at least one member selected from the group consisting of Cu and Fe and catalyzes an oxidation reaction of a per-compound oxidizing agent with a substrate during polishing.

18. A polishing composition for use in combination with an oxidizing agent for polishing a substrate, said composition comprising:

an abrasive particle having a surface on which are bonded at least one stabilizer and at least one catalyst, wherein the abrasive is a member selected from the group consisting of alumina, titania, zirconia, germania, silica, ceria and mixtures thereof, the at least one stabilizer comprises phosphorus, the at least one catalyst comprises Cu or Fe and catalyst catalyzes an oxidation reaction of the oxidizing agent with a substrate, and the stabilizer is bonded to the abrasive prior to the bonding the catalyst to the abrasives;

an oxidizing agent; and a medium in which the abrasive and the oxidizing agent are contained.

19. The composition of claim 12, wherein the abrasive is a member selected from the group consisting of alumina, titania, zirconia, germania, silica, ceria and mixtures thereof, the at least one stabilizer comprises W in the form of tungstate, the at least one catalyst comprises Cu or Fe, and the stabilizer is bonded to the abrasive prior to the bonding the catalyst to the abrasive.

20. The composition of claim 12, wherein the abrasive is a member selected from the group consisting of alumina, titania, zirconia, germania, silica, ceria and mixtures thereof, the at least one stabilizer comprises B in the form of boric acid, and the at least one catalyst comprises at least one member selected from the group consisting of Cu and Fe, wherein the borate is bonded to the abrasive prior to bonding the catalyst to the abrasive.

21. The composition of claim 12, wherein the abrasive is a member selected from the group consisting of alumina, titania, zirconia, germania, silica, ceria and mixtures thereof, the at least one stabilizer comprises B in the form of boric acid, the at least one catalyst comprises at least one member selected from the group consisting of Cu and Fe, and wherein the abrasive particles having a surface on which are bonded at least one stabilizer and at least one catalyst have a positive zeta potential.

22. The composition of claim 12, wherein the abrasive is a member selected from the group consisting of alumina, titania, zirconia, germania, silica, ceria and mixtures thereof, the at least one stabilizer comprises Al, and the at least one catalyst comprises at least one member selected from the group consisting of Cu and Fe, wherein the stabilizer is bonded to the abrasive prior to bonding the catalyst to the abrasive.

* * * * *

UNITED STATES PATENT AND TRADEMARK OFFICE
CERTIFICATE OF CORRECTION

PATENT NO.         : 7,077,880 B2
APPLICATION NO. : 10/759666
DATED              : July 18, 2006
INVENTOR(S)        : Junaid Ahmed Siddiqui et al.

It is certified that error appears in the above-identified patent and that said Letters Patent is hereby corrected as shown below:

Column 13, line 11

In claim 20 delete "borate" and insert --stabilizer--

Signed and Sealed this

Tenth Day of October, 2006

JON W. DUDAS
*Director of the United States Patent and Trademark Office*